United States Patent
Le Gal et al.

(10) Patent No.: US 11,579,220 B2
(45) Date of Patent: Feb. 14, 2023

(54) ELLIPTICAL POLARISATION MAGNETOMETER WITH TWO RADIOFREQUENCY FIELD COMPONENTS FOR PARAMETRIC RESONANCE DETECTION IN ABSORPTION

(71) Applicant: COMMISSARIAT A L'ENERGIE ATOMIQUE ET AUX ENERGIES ALTERNATIVES, Paris (FR)

(72) Inventors: Gwenael Le Gal, Grenoble (FR); Agustin Palacios Laloy, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/445,416

(22) Filed: Aug. 19, 2021

(65) Prior Publication Data

US 2022/0065957 A1   Mar. 3, 2022

(30) Foreign Application Priority Data

Aug. 27, 2020   (FR) ..................... 20 08751

(51) Int. Cl.
*G01R 33/26*   (2006.01)
(52) U.S. Cl.
CPC ................... *G01R 33/26* (2013.01)
(58) Field of Classification Search
CPC ....... G01R 33/26; G01R 33/032; G01R 33/60
See application file for complete search history.

(56) References Cited

U.S. PATENT DOCUMENTS

2016/0223627 A1\* 8/2016 Shah ................ G01R 33/26
2019/0250223 A1   8/2019 Palacios Laloy

FOREIGN PATENT DOCUMENTS

EP   3 364 204 A1   8/2018
EP   3 524 990 A1   8/2019

OTHER PUBLICATIONS

French Preliminary Search Report dated Jul. 1, 2021 in French Application 20 08751 filed on Aug. 27, 2020, 2 pages (with English Translation of Categories of Cited Documents).

(Continued)

*Primary Examiner* — Jay Patidar
(74) *Attorney, Agent, or Firm* — Oblon, McClelland, Maier & Neustadt, L.L.P.

(57) ABSTRACT

A parametric resonance magnetometer is provided comprising a cell filled with an atomic gas; an optical pumping source arranged to emit a light beam in a direction of the cell; a polarization device configured so that by the effect of the light beam, the atomic gas simultaneously acquires a state aligned according to an alignment direction and a state oriented according to an orientation direction; a parametric resonance excitation source configured to generate a radiofrequency magnetic field in the cell; and a device to detect parametric resonances and to measure an absorption of the light beam by the atomic gas. The parametric resonance excitation source is configured so that the radiofrequency magnetic field consists of two components orthogonal to one another, each oscillating at its natural oscillation frequency. The two components include a component longitudinal to the orientation direction and a component longitudinal to the alignment direction.

8 Claims, 1 Drawing Sheet

(56) References Cited

OTHER PUBLICATIONS

Beato et al., "Theory of a $^4$He parametric-resonance magnetometer based on atomic alignment", Physical Review A, vol. 98, No. 5, Nov. 26, 2018, 10pages.
U.S. Appl. No. 16/675,828, filed Nov. 6, 2019, 2020/0150196 A1 May 2020, Beato, F, et al.
U.S. Appl. No. 16/723,096, filed Dec. 20, 2019, 2020/0200839 A1 Jun. 2020, Palacios Laloy, A, et al.
U.S. Appl. No. 16/801,282, filed Feb. 26, 2020, 2020/0278404 A1 Sep. 2020, Lieb, G, et al.
U.S. Appl. No. 16/812,664, filed Mar. 9, 2020, 2020/0292639 A1 Sep. 2020, Le Prado, M, et al.
U.S. Appl. No. 16/939,444, filed Jul. 27, 2020, 2021/0033686 A1 Feb. 2021, Garces Malonda, R, et al.
U.S. Appl. No. 17/307,329, filed May 4, 2021, Palacios Laloy, A.
U.S. Appl. No. 17/335,296, filed Jun. 1, 2021, Le Gal, G, et al.

\* cited by examiner

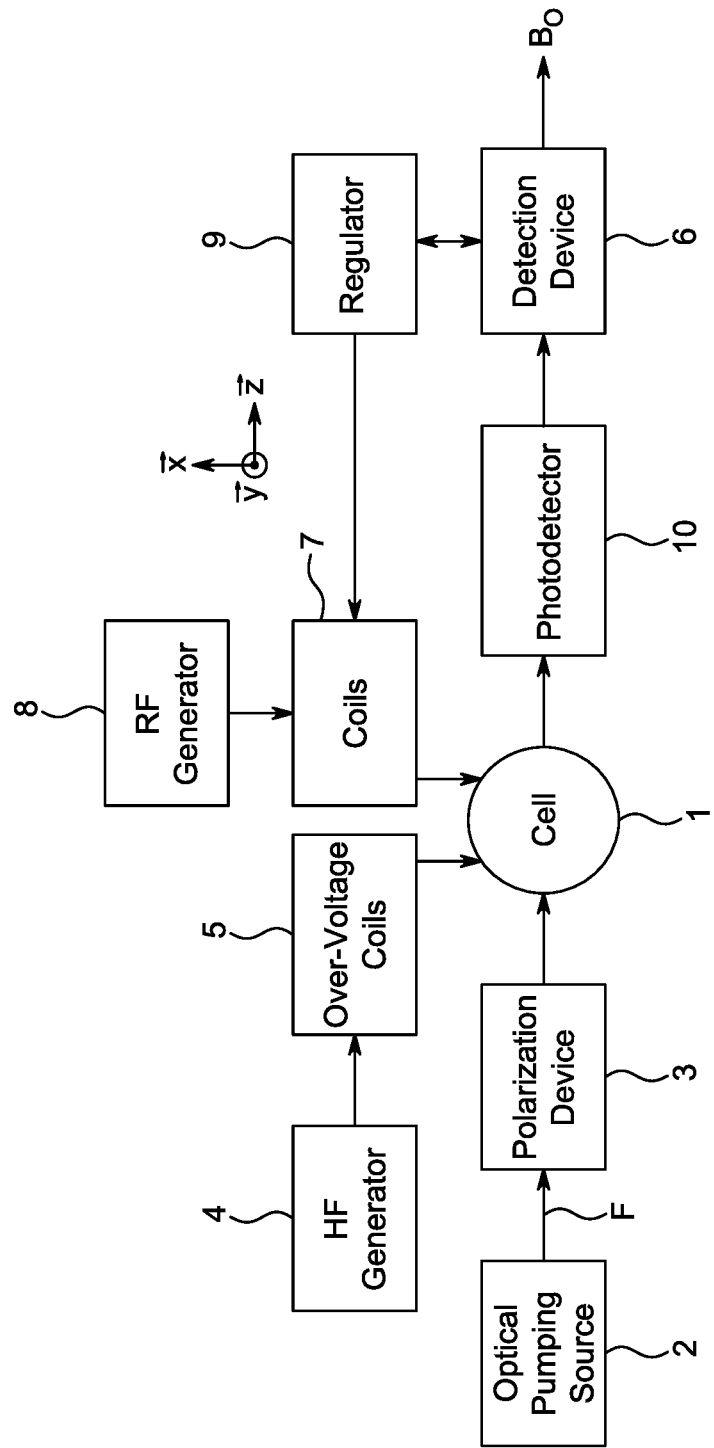

ELLIPTICAL POLARISATION MAGNETOMETER WITH TWO RADIOFREQUENCY FIELD COMPONENTS FOR PARAMETRIC RESONANCE DETECTION IN ABSORPTION

TECHNICAL FIELD

The field of the invention is that of optical pumping magnetometers and more particularly that of parametric resonance magnetometers.

PRIOR ART

Optical pumping magnetometers use atomic gases confined in a cell, typically metastable helium or alkaline gases, as a sensitive element. These magnetometers, which may be implemented in different configurations, allow deducing the magnetic field by making use of the following three processes which take places sequentially or concomitantly:

1) The use of polarised light sources, typically lasers, allows preparing atomic states characterised by a determined orientation or alignment of their spins. This process is called "optical pumping" in the industry.

2) These atomic states evolve by the effect of the magnetic field, in particular by Zeeman effect which corresponds to shifts in the energy levels as a function of the magnetic field to which the atoms are subjected.

3) The optical properties of the atomic medium then undergo modifications which depend on the state of the atoms. Thus, it is possible to deduce the Zeeman shift that is undergone and reach a measurement of the magnetic field in which the cell is immersed through an optical measurement, for example through an optical absorption measurement.

Depending on the different possible configurations of existing optical pumping magnetometers, it is possible to distinguish a measurement of the modulus, also called norm, of the magnetic field for scalar magnetometers or a measurement of the different components of the magnetic field for vector magnetometers.

The levels of sensitivity, also called low-noise, and of correctness that can be achieved with such optical pumping magnetometers are noteworthy and substantially better than those of most of the other magnetic measurement technologies (fluxgate, Hall effect, magnetoresistance, etc.). Only the SQUID-type magnetometer has a similar noise but it requires a cryogenic cooling of the sensitive element which contains elements having to be superconductor to operate, which restricts its practical field of application.

It is possible to distinguish two main categories of optical pumping magnetometers depending on the type of pumping that is carried out.

In the most widespread category, pumping is carried out with a pump beam emitting a light with a circular polarisation and the atomic gas acquires a so-called oriented state characterised by a non-zero average value of its magnetic moment according to an axis, which is actually the axis of propagation of the pump beam.

In the other category, pumping is carried out with a pump beam emitting a light with a linear polarisation and the atomic gas acquires a so-called aligned state characterised by a zero value of its magnetic moment, but by a non-zero value of a ($3 F_z^2 - F^2$) type quantity where F is the total kinetic moment and $F_z$ the kinetic moment along the polarisation direction of the pumping beam.

The characterisation of the atomic states (step 3 hereinabove) may be carried out according to at least two schemes:
  by measuring the absorption of a beam aligned, or tuned, on (or very close to) the considered atomic transition (the beam used for pumping or a so-called "probe" beam with the same polarisation as the beam used for pumping);
  by using a so-called "probe" beam with a linear polarisation and whose wavelength is shifted with respect to the considered atomic transition. Depending on the type of atomic polarisation (orientation or alignment), this beam undergoes a modification of its polarisation (rotation of the polarisation plane in the case of orientation, creation of a circularly polarised component in the case of alignment) which could be measured by separating two of the polarisation states of the beam (the two polarisations at 45° in the case of orientation, the two circular polarisations in the case of alignment) and then by photodetecting them so as to determine the increase of one of the polarisations relative to the other. This is referred to as polarimetric measurement.

Two physical effects allow carrying out a vector measurement of the magnetic field. This consists of Hanle effect and parametric resonances.

The first effect is mainly used in orientation magnetometers and exists in different variants to be probed, mainly in polarimetry, through a Faraday rotation measurement or a modulation of the polarisation of the probe beam. Its main advantage lies in that it enables a "totally-optical" measurement of one or two components of the magnetic field without requiring the application of radiofrequency (RF) magnetic field(s). However, the Hanle configurations in orientation require several (pump or probe) laser beams propagate orthogonally to one another and therefore suffer from a low compactness.

The parametric resonances are used in the magnetometers in orientation and in alignment, mainly in absorption. The difference with the Hanle effect lies in the application of radiofrequency magnetic fields on the cell containing the sensitive element which allow highlighting linear dependences of some frequency components of the photodetection signal as a function of the components of the magnetic field.

The advantage of this last architecture type is that a measurement of one or several component(s) of the magnetic field could be carried out using one single laser beam acting as a pump and probe, thereby allowing making more compact magnetometers. Thus, the use of this effect is often preferred for medical applications such as magnetoencephalography or magnetocardiography which require a high density of sensors over the studied area. However, in the common architecture of parametric resonance magnetometers in alignment, the sensitivity to the component of the magnetic field parallel to the linear direction of the polarisation of the laser beam is much degraded in comparison with that of the two other components. The noise associated to the measurement of the field according to this third axis induces considerable uncertainties regarding the magnitude of these sources or their location, in particular for biomedical applications, while should the three components be subjected to the same noise, this uncertainty would be reduced almost by one order of magnitude.

One pumping type that is seldom used in the optical pumping magnetometry field is that of elliptical polarisation pumping, namely a polarisation that corresponds to the superimposition of a linear polarisation and of a circular polarisation. Such an elliptical polarisation allows obtaining an oriented state and an aligned state at the same time in the atomic gas, proportionally to the degree of ellipticity of the pumping light and when the atomic states allow doing so (i.e. on a state having a total kinetic moment greater than or equal to 1).

Such an elliptical polarisation has been adopted in the architecture described in the patent application EP 3 524 990 in order to benefit from a better sensitivity on the third measurement axis. This architecture requires the application of three radiofrequency fields and requires the separation of the circular and linear bases of light to analyse the optical properties of the atomic medium.

DISCLOSURE OF THE INVENTION

There is a need to provide a parametric resonance magnetometer which offers a reduced noise level according to the third measurement axis and which is simpler to implement than that described in the application EP 3 524 990 A1.

To this end, one embodiment provides a parametric resonance magnetometer comprising:
- a cell filled with an atomic gas;
- an optical pumping source arranged so as to emit a light beam in the direction of the cell;
- a device for polarising the light beam configured so that by the effect of the light beam, the atomic gas simultaneously acquires a state aligned according to an alignment direction and a state oriented according to an orientation direction;
- a parametric resonance excitation source configured so as to generate a radiofrequency magnetic field in the cell;
- a device for detecting parametric resonances configured so as to measure the absorption of the light beam by the atomic gas.

The parametric resonance excitation source is configured so that the radiofrequency magnetic field generated in the cell consists of two components orthogonal to one another and each oscillating at its natural oscillation frequency.

The light beam crosses the cell according to a direction of propagation, the polarisation device being configured so that the alignment direction is orthogonal to the direction of propagation of the light beam and the orientation direction is longitudinal to the direction of propagation of the light beam and the parametric resonance excitation source is configured so that said two components comprise a component longitudinal to the orientation direction at a direction longitudinal to the alignment direction.

These preferred, yet non-limiting, aspects of this magnetometer are as follows:
- the oscillation frequency of the component longitudinal to the alignment direction is higher than the oscillation frequency of the component longitudinal to the orientation direction;
- it is such that $0.1 < \gamma B_1/\omega < 1.2$ and $0.1 < \gamma B_2/\Omega < 1.2$, with $B_1$ the amplitude of the component longitudinal to the alignment direction, $\omega/2\pi$ the oscillation frequency of the component longitudinal to the alignment direction, $B_2$ the amplitude of the component longitudinal to the orientation direction, $\Omega/2\pi$ the oscillation frequency of the component longitudinal to the orientation direction and $\gamma$ the gyromagnetic ratio of the atomic gas;
- it further comprises a photodetector arranged so as to receive the light beam having crossed the cell and to output a photodetection signal to the parametric resonance detection device;
- the parametric resonance detection device is configured so as to carry out a synchronous detection of the photodetection signal at a harmonic of the oscillation frequency of each of the two components and at an inter-harmonic of the oscillation frequencies of the two components;
- the polarisation device is configured so as to confer an elliptical polarisation on the light beam;
- the polarisation device comprises a linear polariser having a transmission axis followed by a quarter-wave plate having neutral axes one of which is parallel to the alignment direction;
- the transmission axis of the linear polariser is rotated by an angle comprised between 21° and 31° with respect to that amongst the neutral axes of the quarter-wave plate that is parallel to the alignment direction.

BRIEF DESCRIPTION OF THE DRAWINGS

Other aspects, objects, advantages and features of the invention will become more apparent upon reading the following detailed description of preferred embodiments thereof, provided as a non-limiting example, and made with reference to the appended drawings wherein:

FIG. 1 is a diagram of a magnetometer in accordance with one embodiment.

DETAILED DISCLOSURE OF PARTICULAR EMBODIMENTS

Referring to FIG. 1, it relates to an optical pumping magnetometer which comprises a cell 1 filled with an atomic gas, for example helium 4 or an alkaline gas, subjected to an ambient magnetic field $B_0$ whose projection on three axes of rectangular coordinates $\vec{x}$, $\vec{y}$ and $\vec{z}$ defines three components thereof. Thus, the ambient magnetic field $B_0$ is divided into three components $B_x$, $B_y$ and $B_z$ each according to one of the measurement axes of the magnetometer X, Y and Z. More particularly, the magnetometer is for example a three-axis vector magnetometer, i.e. adapted to carry out a measurement of each of the three components $B_x$, $B_y$ and $B_z$ of the ambient magnetic field.

The cell is illuminated by an optical pumping source 2 adapted to emit in the direction of the cell 1 a light beam F, for example a laser beam, tuned to a pumping wavelength (thus, this beam is also referred to as pump beam). The pumping wavelength is aligned, or tuned, on the atomic transition line, for example on the line $D_0$ at 1083 nm in the case of helium-4.

Using a pump beam tuned on the atomic transition used for optical pumping allows getting rid of the undesirable effects of the phenomenon known as "light-shift", in particular so-called vector "light-shift" that appears when the atoms are illuminated by a circularly polarised light non-resonant with an atomic transition and also so-called tensor "light-shift" that results in coupling the alignment and the orientation.

In the case where the sensitive element is helium-4, the magnetometer 10 further includes a high-frequency (HF) discharge system, comprising a HF generator 4 and over-voltage coils 5, to set the atoms of the atomic gas in an energised state where they could undergo an atomic transition when they are illuminated by the laser beam, typically in the metastable state $2^3S_1$.

In the context here described, the light beam F used for pumping (i.e. the preparation of the atomic states necessary for a measurement of the magnetic field) is also used as a probe beam for the detection of the atomic states induced by pumping, its absorption by the atoms actually carrying information on the value of the components of the static magnetic field to which the cell is subjected. The beam F propagates according to a direction of propagation which is oriented according to the direction $\vec{z}$ in FIG. 1.

The magnetometer also comprises a parametric resonance excitation circuit which includes a radiofrequency generator 8 which supplies Helmholtz coils 7 with orthogonal axes which surround the cell in order to generate a parametric resonance excitation magnetic field, also referred to as radiofrequency magnetic field. Moreover, the magnetometer comprises a parametric resonance detection device 6 configured so as to measure the absorption of the light beam by the atomic gas and a photodetector 10 arranged so as to receive the light beam having crossed the cell and to output a photodetection signal to said parametric resonance detection device 6.

The cell 1 and coils 7 set is placed within a passive magnetic shield made of a μ-metal in order to isolate it from ambient magnetic fields (terrestrial field and electromagnetic disturbances), which are too strong to meet the physical condition $\gamma B_0 \ll \Gamma$ necessary for the apparition of the parametric resonances where γ refers to the gyromagnetic ratio of the atoms of the atomic gas and Γ the relaxation rate of the atoms of the atomic gas.

The magnetometer may also comprise a closed-loop servo-control system of the magnetometer to constantly subject the sensitive element to a zero total magnetic field. The servo-control system comprises a regulator 9 coupled to the detection device 6 and which injects a current in the Helmholtz coils 7 in order to generate a compensation magnetic field Bc such that the sum $Bc+B_0$ is permanently maintained at zero.

Alternatively, the magnetometer may be operated in open loop, without ambient field compensation.

The light beam F is polarised by means of a device 3 for polarising the light beam. This device 3, interposed between the optical pumping source 2 and the cell 1 or directly integrated to the optical pumping source, allows conferring a very specific polarisation on the light before it crosses the cell.

In one embodiment, the light beam is a laser beam conveyed by an optical fibre at the end of which it diverges with an angle depending on the numerical aperture of the used fibre. This divergent beam is collimated before crossing the cell, for example using a convergent lens. At the outlet of this set enabling the collimation, the beam passes through the polarisation device 3. After passage in the cell, the laser beam passes through a so-called projection lens which allows expanding (divergent lens) or focusing (convergent lens) the collimated beam on the photodetector 10.

In the context here described, the polarisation device 3 is more particularly configured so that, by the effect of the light beam, the atomic gas simultaneously acquires a state aligned according to an alignment direction and a state oriented according to an orientation direction.

Thus, the polarisation device 3 may be configured so as to simultaneously confer a linear polarisation and a circular polarisation on the light beam, the beam emitted in the direction of the cell being therefore elliptically polarised.

An effect of such an elliptical polarisation is the preparation of the atomic states according to an orientation and alignment resulting from both a linear polarisation and a circular polarisation. Thus, the state acquired by the atoms of the atomic gas in the cell is both aligned (according to an alignment direction) and oriented (according to an orientation direction), proportionally to the degree of ellipticity of the polarisation. More particularly, the state of the atoms is divided into an orientation along the direction of propagation of the light beam and an alignment directed mainly along the vertical axis, orthogonal to the direction of propagation of the pump beam (the alignment including a small proportion longitudinal to the direction of propagation of the pump due to the pumping with a light partially circularly polarised on an atomic state with a total kinetic moment greater than or equal to 1). Thus, the orientation direction is longitudinal to the direction of propagation (i.e. according to the direction $\vec{z}$) whereas the alignment direction is orthogonal to the direction of propagation (according to the direction $\vec{x}$ in the reference frame of FIG. 1).

Such a polarisation device 3 conferring an elliptical polarisation on the light beam may comprise a linear polariser and a quarter-wave plate whose neutral axes are rotated by an angle different from 45° with respect to the transmission axis of the linear polariser. More particularly, one of neutral axes (slow or rapid) of the quarter-wave plate is parallel to the alignment direction (i.e. the direction $\vec{x}$). The linear polariser is placed before the quarter-wave plate on the optical path. Thus, the polarisation device 3 confers an elliptical polarisation characterised by a semi-major axis of the ellipse which lies aligned with that of the neutral axes of the quarter-wave plate which forms the smallest angle with the transmission axis of the linear polariser place before the quarter-wave plate. For example, a configuration for which the semi-major axis of the ellipse lies aligned with the alignment direction is selected.

Preferably, the transmission axis of the linear polariser is rotated by an angle comprised between 21° and 31°, for example 26°, with respect to that of the neutral axes of the quarter-wave plate that is parallel to the alignment direction. Thus, the semi-major axis of the ellipse lies aligned with the alignment direction. Moreover, the selection of this angle range is justified by a +/−5° inaccuracy on setting of the 26° value in miniature configurations where this angle is set by bonding. The inventors were able to check up in laboratory configurations, where this angle could be set accurately, that this angle range allows obtaining signals with a particularly favourable sensitivity according to criteria that will be detailed hereinafter.

Alternatively, the polarisation device 3 may be configured to alternately confer a linear polarisation and then a circular polarisation. Such a polariser 3 may comprise a linear polariser and an electrically-controllable delay plate. This plate is modulated with a square wave so that, during the half-periods where its output level is high (denoted SH), it behaves like a quarter-wave plate, while during the low-level half-periods (denoted SL), it behaves like a delay-less plate or like a half-wave plate. Thus, during the half-periods SH, the beam emitted in the direction of the cell is circularly polarised and the atomic states in the cell are oriented. And during the half-periods SL, the beam emitted in the direction of the cell is linearly polarised and the atomic states in the cell are aligned. The dynamics of the cells being dominated by a relaxation time in the range of 1 ms, by adopting a more rapid SL/SH modulation, the atoms are placed in a superimposition of the aligned and oriented states. Hence, this is not a successive passage through these two states but rather the concomitance of the two properties.

In contrast with the magnetometer described in the application EP 3 524 990 which requires a radiofrequency magnetic field including three components, the magnetometer here described requires only two. Thus, the parametric resonance excitation source is configured so that the radiofrequency magnetic field generated in the cell by means of the Helmholtz coils 7 has two components orthogonal to one another and each oscillating at its natural oscillation frequency. More particularly, said components comprise a component longitudinal to the orientation direction (according to $\vec{z}$) and a component longitudinal to the alignment direction (according to $\vec{x}$).

Thus, a first component $B_1\vec{x} \cos(\omega t)$ with a frequency $\omega/2\pi$ is applied according to the main direction of the atomic alignment and a second component $B_2\vec{z} \cos(\Omega t)$ with a frequency $\Omega/2\pi$ is applied according to the orientation direction of the atoms (i.e. direction of propagation of the pumping beam). The first component controls the evolution of the atomic orientation (and of the alignment residue directed according to this orientation direction) and enables the measurement of the component of the magnetic field parallel to the main direction of the atomic alignment. The second component controls the evolution of the transverse atomic alignment and enables the measurement of the component of the magnetic field parallel to the direction of propagation of the pump beam.

Preferably, the frequency $\omega/2\pi$ of the first component is higher than the frequency $\Omega/2\pi$ of the second component so that the dynamics of the atomic states optically pumped by each component of the radiofrequency field are time-decoupled. Thus, the dynamics in the rapid component at the frequency $\omega/2\pi$ must be "too" rapid for the slow component at the frequency $\Omega/2\pi$ in order not to affect the dynamics of the spins in the latter. In turn, these dynamics in the slow component must be "too" rapid in comparison with the natural dynamics of the spins (relaxation rate $\Gamma$) and that in the static field $B_0$ to be measured (Larmor frequency $f_L = \gamma B_0$).

Furthermore, the rapid RF field component ($\omega$) is to be applied according to the axis $\vec{x}$ (direction of the semi-major axis of the ellipse) and the slow component ($\Omega$) is to be directed according to the axis $\vec{z}$, the direction of propagation of the laser beam. The inventors were actually able to check that, should the RF field components have to be reversed, the sensitivities at the obtained isotropic operating point would be lower.

Preferably, the ratios $\gamma B_1/\omega$ and $\gamma B_2/\Omega$ (with $\gamma$ the gyromagnetic ratio of the atomic gas, for example $\gamma=2\pi\times 28$ rad/nT·s for the state $2^3S_1$ of helium-4) which control the sensitivities of the measurement of the magnetic field are set such that $0.1<\gamma B_1/\omega<1.2$ and $0.1<\gamma B_2/\Omega<1.2$. In such a manner, the existence of an operating point where the sensitivity of each measurement axis represents between 30% and 37% of the sum of the sensitivity on the three axes, for angles from 21° to 31°, is ensured.

The parametric resonance detection device 6 configured so as to measure the absorption of the light beam by the atomic gas measures the light transmitted by the atoms on the elliptical base, i.e. only with a photodetector and possibly collimation optics at the outlet of the cell, and so without the addition of intermediate optical elements allowing separating the linear and circular bases of light between the cell containing the sensitive element and the photodetector as is the case for the magnetometer described in the application EP 3 524 990.

To determine a measurement of each of the three components of the ambient magnetic field, the parametric resonance detection device 6 is configured so that a synchronous detection of the photodetection signal at a harmonic of each of the oscillation frequencies ($\omega$ and $\Omega$) and at an inter-harmonic of said oscillation frequencies ($\omega\pm\Omega$). A demodulation of the photodetection signal at the frequency $\omega$ enables a measurement of the component of the magnetic field parallel to the main direction of alignment of the atoms ($B_x$), a demodulation at the frequency $\Omega$ enables a measurement of the component of the magnetic field parallel to the direction of propagation of the pump beam ($B_z$). The last component of the magnetic field ($B_y$), orthogonal to the direction of application of the two components of the radiofrequency field, is obtained by demodulating the photodetection signal at one of the inter-harmonics $\omega\pm\Omega$.

In one embodiment, the angle between the natural axis of the quarter-wave plate parallel to the direction $\vec{x}$ and the transmission axis of the linear polariser is set at 26°, the frequency $\omega/2\pi$ is set at 40 kHz, the frequency $\Omega/2\pi$ is set at 15 kHz. The ratios $\gamma B_1/\omega$ and $\gamma B_2/\Omega$ are respectively set at 0.97 and 0.76, corresponding to amplitudes of the components of the radiofrequency field $B_1=1385$ nT and $B_2=407$ nT.

In another embodiment, the angle between the natural axis of the quarter-wave plate parallel to the direction $\vec{x}$ and the transmission axis of the linear polariser is set at 26°, the frequency $\omega/2\pi$ is set at 40 kHz, the frequency $\Omega/2\pi$ is set at 9 kHz. The ratios $\gamma B_1/\omega$ and $\gamma B_2/\Omega$ are respectively set at 0.76 and 0.99, corresponding to amplitudes of the components of the radiofrequency field $B_1=1085$ nT and $B_2=530$ nT. In this embodiment, the sensitivity at each axis is slightly lower than is the case in the previous example but it is perfectly isotropic.

The invention claimed is:
1. A parametric resonance magnetometer, comprising:
a cell filled with an atomic gas;
an optical pumping source configured to emit a light beam in a direction of the cell;
a polarization device configured to polarize the light beam so that by an effect of the light beam, the atomic gas simultaneously acquires a state aligned according to an alignment direction and a state oriented according to an orientation direction;
a parametric resonance excitation source configured to generate a radiofrequency magnetic field in the cell;
a parametric resonance device configured to detect parametric resonances and configured to measure an absorption of the light beam by the atomic gas,
wherein the parametric resonance excitation source is further configured so that the radiofrequency magnetic field generated in the cell consists of two components orthogonal to one another, each oscillating at a corresponding oscillation frequency,
wherein the light beam crosses the cell according to a direction of propagation, the polarization device being configured so that the alignment direction is orthogonal to the direction of propagation of the light beam and the orientation direction is longitudinal to the direction of propagation of the light beam, and
the parametric resonance excitation source is further configured so that said two components comprise a component longitudinal to the orientation direction and a component longitudinal to the alignment direction.
2. The magnetometer according to claim 1, wherein the oscillation frequency of the component longitudinal to the alignment direction is higher than the oscillation frequency of the component longitudinal to the orientation direction.

3. The magnetometer according to claim 2, wherein $0.1 < \gamma B_1/\omega < 1.2$ and $0.1 < \gamma B_2/\Omega < 1.2$, with $B_1$ being an amplitude of the component longitudinal to the alignment direction, $\omega/2\pi$ being the oscillation frequency of the component longitudinal to the alignment direction, $B_2$ being an amplitude of the component longitudinal to the orientation direction, $\Omega/2\pi$ being the oscillation frequency of the component longitudinal to the orientation direction, and $\gamma$ being a gyromagnetic ratio of the atomic gas.

4. The magnetometer according to claim 1, further comprising a photodetector configured to receive the light beam having crossed the cell and output a photodetection signal to the parametric resonance detection device.

5. The magnetometer according to claim 4, wherein the parametric resonance detection device is further configured to perform a synchronous detection of the photodetection signal at a corresponding harmonic of the oscillation frequency of each of the two components and at an interharmonic of the oscillation frequencies of the two components.

6. The magnetometer according to claim 1, wherein the polarization device is further configured to confer an elliptical polarization on the light beam.

7. The magnetometer according to claim 6, wherein the polarization device comprises a linear polarizer having a transmission axis followed by a quarter-wave plate having neutral axes, one of which is parallel to the alignment direction.

8. The magnetometer according to claim 7, wherein the transmission axis of the linear polarizer is rotated by an angle between 21° and 31° with respect to one of the neutral axes of the quarter-wave plate that is parallel to the alignment direction.

* * * * *